United States Patent
Xu et al.

(10) Patent No.: US 12,279,463 B2
(45) Date of Patent: *Apr. 15, 2025

(54) SOLAR CELL AND SOLAR CELL MODULE

(71) Applicants: Jinko Green Energy (Shanghai) Management Co., LTD., Shanghai (CN); ZHEJIANG JINKO SOLAR CO., LTD., Zhejiang (CN)

(72) Inventors: Menglei Xu, Shanghai (CN); Jie Yang, Shanghai (CN); Xinyu Zhang, Shanghai (CN); Hao Jin, Shanghai (CN)

(73) Assignees: Jinko Green Energy (Shanghai) Management Co., LTD., Shanghai (CN); Zhejiang Jinko Solar Co., Ltd., Haining (CN)

( * ) Notice: Subject to any disclaimer, the term of this patent is extended or adjusted under 35 U.S.C. 154(b) by 20 days.

This patent is subject to a terminal disclaimer.

(21) Appl. No.: 18/341,600

(22) Filed: Jun. 26, 2023

(65) Prior Publication Data

US 2023/0343881 A1    Oct. 26, 2023

Related U.S. Application Data (63) Continuation of application No. 17/390,857, filed on Jul. 30, 2021, now Pat. No. 11,728,446.

(30) Foreign Application Priority Data

Jun. 30, 2021 (CN) .......................... 202110738433.7

(51) Int. Cl.
*H10F 77/20* (2025.01)
*H10F 77/00* (2025.01)
*H10F 77/164* (2025.01)

(52) U.S. Cl.
CPC ....... *H10F 77/227* (2025.01); *H10F 77/1645* (2025.01); *H10F 77/955* (2025.01)

(58) Field of Classification Search
CPC ....... H01L 31/022458; H01L 31/02021; H01L 31/03685; H01L 31/0747;
(Continued)

(56) References Cited

U.S. PATENT DOCUMENTS

| | | | |
|---|---|---|---|
| 10,629,758 B2 | 4/2020 | Rim et al. | |
| 2009/0223562 A1* | 9/2009 | Niira | H01L 31/0747 257/E31.124 |

(Continued)

FOREIGN PATENT DOCUMENTS

| | | |
|---|---|---|
| CN | 107068778 B | 6/2015 |
| CN | 105794004 B | 5/2018 |

(Continued)

OTHER PUBLICATIONS

Jinko Green Energy (Shanghai) Management Co., LTD. et al., US Non-Final Rejection, U.S. Appl. No. 17/390,857, filed Oct. 14, 2022, 12 pgs.

(Continued)

*Primary Examiner* — Andrew J Golden
(74) *Attorney, Agent, or Firm* — USCH Law, PC (57) ABSTRACT

Embodiments of the present disclosure provide a solar cell and a solar cell module. The solar cell includes a first region and a second region, and further includes a substrate having a first surface and a second surface; a tunneling layer covering the second surface; a first emitter formed on part of the tunneling layer in the first region; and a second emitter formed on part of the tunneling layer in the second region and on the first emitter, a conductivity type of the second emitter being different from a conductivity type of the first emitter. The solar cell further includes a first electrode (Continued)

configured to electrically connect with the first emitter by penetrating through the second emitter; and a second electrode formed in the second region and configured to electrically connect with the second emitter.

18 Claims, 3 Drawing Sheets

(58) Field of Classification Search
CPC .......... H01L 31/022441; H10F 77/227; H10F 77/1645; H10F 77/219; H10F 77/955; H10F 10/146; H10F 10/166
See application file for complete search history.

(56) References Cited

U.S. PATENT DOCUMENTS

| | | |
|---|---|---|
| 2012/0021557 A1 | 1/2012 | Kim et al. |
| 2013/0008494 A1 | 1/2013 | Bateman et al. |
| 2015/0144183 A1* | 5/2015 | Yang .................. H01L 31/0747 |
| | | 438/57 |
| 2015/0171230 A1 | 6/2015 | Kapur et al. |
| 2015/0179838 A1 | 6/2015 | Rim et al. |
| 2015/0357491 A1* | 12/2015 | Kimoto ........... H01L 31/022441 |
| | | 136/256 |
| 2016/0071996 A1* | 3/2016 | Swanson ......... H01L 31/022441 |
| | | 136/258 |
| 2016/0087122 A1* | 3/2016 | Westerberg ..... H01L 31/022441 |
| | | 136/258 |
| 2020/0279968 A1 | 9/2020 | Bende et al. |

FOREIGN PATENT DOCUMENTS

| | | |
|---|---|---|
| DE | 102013207189 A1 | 10/2014 |
| WO | 2013096500 A1 | 6/2013 |
| WO | 2016140309 A1 | 9/2016 |

OTHER PUBLICATIONS

Jinko Green Energy (Shanghai) Management Co., LTD. et al., US Final Rejection, U.S. Appl. No. 17/390,857, filed Dec. 30, 2022, 20 pgs.
Jinko Green Energy (Shanghai) Management Co., LTD. et al., US Notice of Allowance, U.S. Appl. No. 17/390,857, filed Mar. 30, 2023, 11 pgs.
Jinko Green Energy (Shanghai) Management Co., Ltd., et al., Extended European Search Report, EP 21188064.6, Nov. 12, 2021, 8 pgs.
Jinko Green Energy (Shanghai) Management Co., LTD. et al., AU First Office Action, AU 2021209203, Jun. 17, 2022, 6 pgs.

* cited by examiner

SOLAR CELL AND SOLAR CELL MODULE

CROSS-REFERENCE TO RELATED APPLICATION

The present application is a continuation of American patent application Ser. No. 17/390,857, entitled "SOLAR CELL AND SOLAR CELL MODULE," filed Jul. 30, 2021, which claims priority to Chinese Patent Application No. 202110738433.7, filed on Jun. 30, 2021, each of which is incorporated by reference herein in its entirety.

TECHNIC FIELD

Embodiments of the present disclosure relate to a photovoltaic technique, in particular to a solar cell and a solar cell module.

BACKGROUND

A solar cell is a photovoltaic device for converting solar radiation energy to electric energy. The solar cell includes a light receiving surface facing the sun to collect the solar radiation energy during normal operation, and a rear surface opposite to the light receiving surface. In an interdigitated back-contact (IBC) solar cell, electrodes and emitters corresponding to the electrodes are formed on the rear surface of the solar cell. An external circuit, such as a load, may be connected to the electrodes of the solar cell for power supply.

In order to enhance the commercial value of the IBC solar cell, it is desired to improve electrical performance of the solar cell and reduce preparation cost of the IBC solar cell.

SUMMARY

Some embodiments of the present disclosure provide a solar cell and a solar cell module, which are beneficial to improving the electrical performance of the solar cell and reducing the preparation cost of the solar cell.

Some embodiments of the present disclosure provide a solar cell, which includes a first region and a second region, and includes a substrate having a first surface and a second surface; a tunneling layer covering the second surface; a first emitter disposed on the tunneling layer of the first region; a second emitter disposed on the tunneling layer of the second region and on the first emitter, a conductivity type of the second emitter being different from a conductivity type of the first emitter; a first electrode disposed in the first region and configured to electrically connect with the first emitter by penetrating through the second emitter; and a second electrode disposed in the second region and configured to electrically connect with the second emitter.

In some embodiments, a sidewall surface of the first emitter is in contact with a sidewall surface of the second emitter.

In some embodiments, the second emitter has a thickness of 30 nm to 200 nm in a direction perpendicular to the second surface.

In some embodiments, a substrate of the second region is convex relative to a substrate of the first region at the second surface of the substrate, the first emitter has a third surface facing away from the tunneling layer, the second emitter has a fourth surface in contact with the tunneling layer, and the third surface is flush with or lower than the fourth surface in a direction away from the second surface of the substrate.

In some embodiments, the tunneling layer includes a first dielectric layer and a second dielectric layer, where the first dielectric layer is disposed between the first emitter and the substrate, the second dielectric layer is configured to cover the second surface of the substrate of the second region and cover a third surface and a sidewall of the first emitter, the third surface is a surface of the first emitter facing away from the first dielectric layer, the second emitter is disposed on the second dielectric layer, and the first electrode is further configured to electrically connect with the first emitter by penetrating through the second dielectric layer.

In some embodiments, a material of the second dielectric layer is different from a material of the first dielectric layer.

In some embodiments, a material of the first dielectric layer includes at least one of oxygen silicide, nitrogen silicide and carbon silicide.

In some embodiments, the second emitter includes a first doped portion and a second doped portion, at least part of the second doped portion is disposed between the first doped portion and the first electrode, a doping concentration of the first doped portion is greater than or equal to a doping concentration of the second doped portion, and doping concentrations of different regions of the second doped portion decreases in a direction of the first doped portion towards the first electrode.

In some embodiments, a concentration gradient of the second doped portion is in a range of $5E16$ atoms$\times$cm$^{-3}$/cm to $2E22$ atoms$\times$cm$^{-3}$/cm.

In some embodiments, a width of the second doped portion is greater than 20 μm in the direction of the first doped portion towards the first electrode.

In some embodiments, the conductivity type of the first emitter is P type, and the conductivity type of the second emitter is N type.

Some embodiments of the present disclosure further provide a solar cell module, which includes: a cell string formed by connecting any one of the above-described solar cells; an encapsulation film configured to cover a surface of the cell string; and a cover plate configured to cover a surface of the encapsulation film facing away from the cell string.

BRIEF DESCRIPTION OF THE DRAWINGS

One or more embodiments are described as examples with reference to the corresponding figures in the accompanying drawings, and the examples do not constitute a limitation to the embodiments. Elements with the similar reference numerals in the accompanying drawings represent similar elements. The figures in the accompanying drawings do not constitute a proportion limitation unless otherwise stated.

DETAILED DESCRIPTION OF THE EMBODIMENTS

Embodiments of the present disclosure will be described in detail below with reference to the accompanying drawings in order to make the objectives, technical solutions and advantages of the present disclosure clearer. However, it will be apparent to those skilled in the art that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 1:
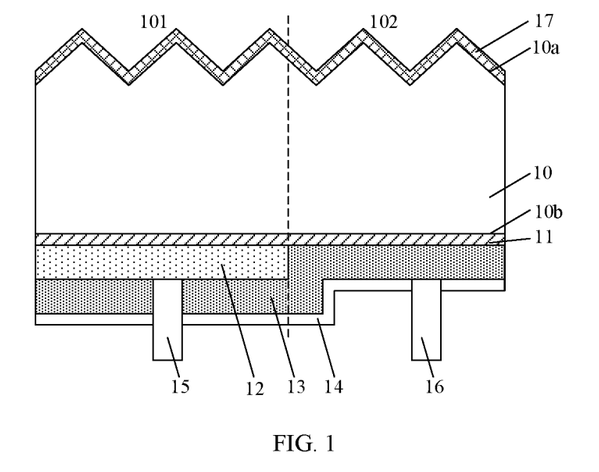
FIG. 1 is a schematic structural diagram of a solar cell according to some embodiments of the present disclosure.
Figure 2:
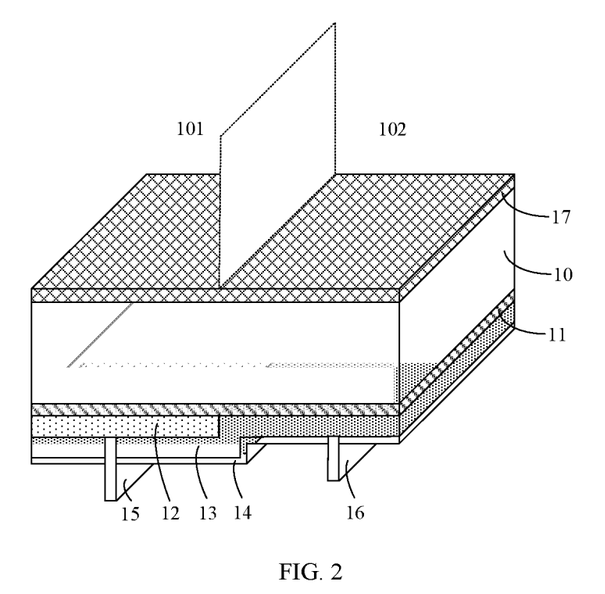
FIG. 2 is a three-dimensional schematic diagram of the solar cell as shown in FIG. 1.

Referring to FIGS. 1 and 2, a solar cell includes a first region 101 and a second region 102. In other words, the first region 101 corresponds to a first portion of the solar cell, and the second region 102 corresponds to a second portion of the solar cell. In some embodiments, the solar cell includes a substrate 10, a tunneling layer 11, a first emitter 12, a second emitter 13, a first electrode 15 and a second electrode 16. The substrate 10 has a first surface 10a and a second surface 10b. The tunneling layer 11 covers the second surface 10b. The first emitter 12 is disposed on the tunneling layer 11 of the first region 101. The second emitter 13 is disposed on the tunneling layer 11 of the second region 102 and on the first emitter 12. The first emitter 12 and the second emitter 13 have different conductivity types. The first electrode 15 is disposed in the first region 101, and is configured to electrically connect with the first emitter 12 by penetrating through the second emitter 13. Herein, the first electrode 15 penetrates through the second emitter 13 means that the first electrode 15 may be in contact with the second emitter 13. The second electrode 16 is disposed in the second region 102 and is configured to electrically connect with the second emitter 13.

In some embodiments, a material of the substrate 10 is a silicon material, which may include one or more of monocrystalline silicon, polycrystalline silicon, amorphous silicon and microcrystalline silicon. In other embodiments, the material of the substrate may also be a carbon simple substance, an organic material or a multinary compound. The multicomponent compound may include, but is not limited to, perovskite, gallium arsenide, cadmium telluride, copper indium selenium, etc.

In some embodiments, the first surface 10a is designated as a light receiving surface, the second surface 10b is a rear surface opposite to the light receiving surface. The first surface 10a may be set as a pyramid textured surface to reduce the reflection of light on the first surface 10a, thus increasing an absorption and utilization rate of the light and improving the conversion efficiency of the solar cell. The solar cell may further include a first passivation layer 14 covering surfaces of the first emitter 12 and the second emitter 13 facing away from the substrate 10. A material of the first passivation layer 14 may include one or more of silicon nitride, silicon oxynitride, silicon carbonitride oxide, titanium oxide, hafnium oxide, aluminum oxide and the like. Accordingly, the solar cell may further include a second passivation layer 17 covering the first surface 10a. A material of the second passivation layer 17 may be silicon nitride, or silicon oxide, etc.

In some embodiments, the substrate 10 includes an N-type doping element (such as phosphorus, arsenic, etc.) and the substrate 10 is N-type substrate; the first emitter 12 includes a P-type doping element; the second emitter 13 includes an N-type doping element. The first emitter 12 and the substrate 10 form a PN junction. The first electrode 15 connected with the first emitter 12 serves as a positive electrode of the solar cell, and the second electrode 16 connected with the second emitter 13 serves as a negative electrode of the solar cell. In other embodiments, the first emitter 12 includes an N-type doping element, the second emitter 13 includes a P-type doping element; the second emitter 13 and the substrate 10 form a PN junction.

It should be noted that although the first emitter 12 and the second emitter 13 are in direct contact in the structure shown in FIG. 1, it does not mean that the positive electrode and the negative electrode of the solar cell are short-circuited. This is because the first emitter 12 and the second emitter 13 contain different types of doped ions, and the same typed carriers in the first emitter 12 and the second emitter 13 have greatly different transmission efficiencies. That is, under the condition of a same transmission path length, a transmission path resistance of the same typed carriers in different emitters is greatly different, which makes the carriers in the first emitter 12 always tend to flow out through the first electrode 15. Besides, since the second emitter 13 generally has a relatively thin thickness and a relatively small cross-sectional area in a direction perpendicular to the second surface 10b, a resistance that the carriers in the second emitter 13 needs to be resisted for a transverse transmission is much greater than a resistance that needs to be resisted for a direct convergence toward the second electrode 16. Therefore, carriers flowing through the tunneling layer 11 to the second emitter 13 always tend to converge toward the second electrode 16. That is to say, even if the first emitter 12 and the second emitter 13 with different conductivity types are in contact with each other, due to a restriction of the transmission path resistance, the solar cell has obviously discrete positive electrode and negative electrode, and the positive electrode and negative electrode of the solar cell may not have obvious short-circuit problem. The present structure overcomes the prejudice of the existing technologies.

In some embodiments, a sidewall surface of the first emitter 12 is in contact with a sidewall surface of the second emitter 13. Further, in the direction perpendicular to the second surface 10b, the second emitter 13 has a thickness of 30 nm to 200 nm, such as 40 nm, 70 nm, 90 nm, 120 nm, 150 nm, 160 nm or the like. If the thickness of the second emitter 13 is less than the above threshold, the field passivation effect of the second emitter 13 of the second region 102 may be relatively weak, and the second region 102 may have a relatively serious carrier recombination problem. If the thickness of the second emitter 13 is greater than the above threshold, then the resistance of the carriers in the second emitter 13 for the transverse transmission is relatively small, and the carriers in the second emitter 13 of the second region 102 is more likely to undergo the transverse transmission to move into the first electrode 15, which is not conducive to suppressing the short circuit problem between the first emitter 12 and the second emitter 13.

Further, by configuring the first electrode 15 away from the second region 102, a path resistance of the carriers in the second emitter 13 of the second region 102 to the first electrode 15 may be increased, and thus a short-circuit current between the first electrode 15 and the second electrode 16 may be suppressed. Similarly, by configuring the second electrode 16 to extend into the second emitter 13, a path resistance of the carriers in the second region 102 to the second electrode 16 may be decreased, and the carriers may be promoted to converge toward the second electrode 16.

In some embodiments, the substrate 10 has a substantially flat second surface 10b. In some embodiments, the flat second surface 10b can be formed by a polishing process. A surface of the first emitter 12 facing the substrate 10 is flush with a surface of the second emitter 13 of the second region 102 facing the substrate 10. The second emitter 13 covers the sidewall surface of the first emitter 12. A specific process for forming the above structure includes: providing the substrate 10 with the second surface 10b and the tunneling layer 11 with a uniform film thickness; sequentially performing a maskless deposition process and a patterned etching process to form the patterned first emitter 12; and performing a second maskless deposition process to form the second emitter 13. That is to say, the above structure may be formed by performing the patterned etching process once. Compared with a traditional process of performing patterned etching processes twice, which respectively configures the positions of the first emitter 12 and the second emitter 13, it is beneficial to reducing the accuracy alignment requirements and the number of masks required, thus improving the electrical performance of the solar cell and reducing the preparation cost of the solar cell.

In some embodiments, compared with a textured surface, configuring the flat second surface 10b is also beneficial to preventing a sunlight incident on the first surface 10a from being transmitted out of the second surface 10b, thereby reducing the light transmission loss of the solar cell and improving the light absorption efficiency of the solar cell.

Figure 3:
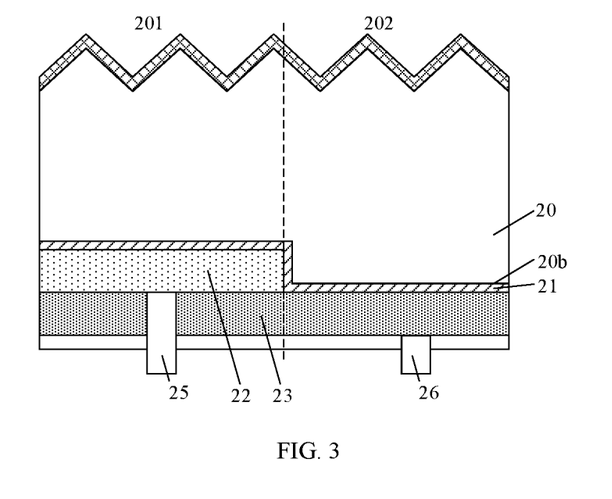
FIG. 3 is a schematic structural diagram of a solar cell according to some embodiments of the present disclosure.

In some embodiments, referring to FIG. 3, the substrate 20 of the second region 202 is convex relative to the substrate 20 of the first region 201, e.g., at the second surface 20b of the substrate 20. Herein, the substrate 20 of the second region 202 refers to a first portion of the substrate 20 corresponding to the second region, and the substrate 20 of the first region 201 refers to a second portion of the substrate 20 corresponding to the first region. The first emitter 22 has a third surface (not labeled) facing away from the tunneling layer 21. The second emitter 23 has a fourth surface (not labeled) in contact with the tunneling layer 21. The third surface is flush with or lower than the fourth surface, e.g., in a direction away from the second surface 20b of the substrate 20. The specific process for forming the above structure includes: patterning and etching the substrate 20 to form a relatively concave-convex second surface 20b; covering the second surface 20b with a tunnel layer 21 having a uniform film thickness; sequentially performing a deposition process and a planarization process to form the first emitter 22 disposed at the first region 201, where the third surface of the first emitter 22 is lower than or flush with a surface of the tunneling layer 21 of the second region away from the substrate; performing a maskless deposition process to form the second emitter 23. That is to say, the above structure may be formed by performing the patterned etching process once, and the second emitter 23 in the structure has a flat surface facing away from the substrate 20, which is beneficial to reducing the complexity of subsequent coating of conductive paste and ensuring that the first electrode 25 and the second electrode 26 have good alignment accuracy.

Herein, when the third surface is lower than the fourth surface, a vertical distance between the third surface and the fourth surface in a direction perpendicular to the second surface 20b may be set to 0.1 µm to 5 µm, such as 1 µm, 2 µm or 3 µm.

Figure 4:
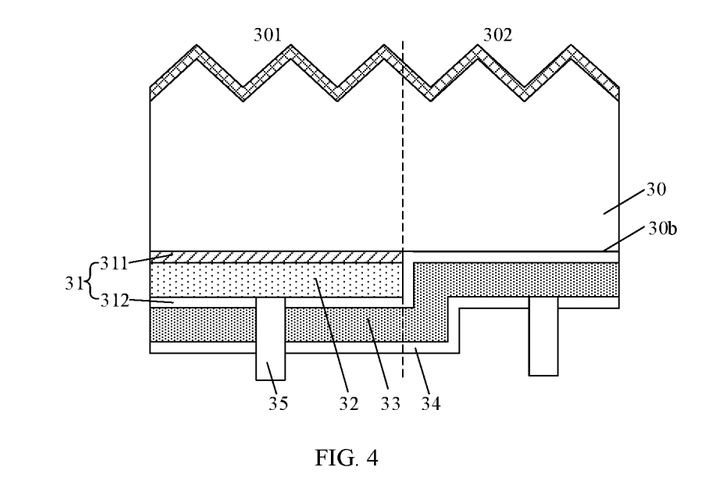
FIG. 4 is a schematic structural diagram of a solar cell according to some embodiments of the present disclosure.

In some embodiments, referring to FIG. 4, the tunneling layer 31 includes a first dielectric layer 311 and a second dielectric layer 312. The first dielectric layer 311 is disposed between the first emitter 32 and the substrate 30, that is, the first dielectric layer 311 is only disposed in the first region 301. The second dielectric layer 312 covers the second surface 30b of the second region 302 as well as a third surface and a sidewall of the first emitter 32. Herein, the second surface 30b of the substrate 30 of the second region 302 refers to the surface of the second portion of the substrate 30 corresponding to the second portion 302. The third surface is a surface of the first emitter 32 facing away from the first dielectric layer 311. The second emitter 33 is disposed on the second dielectric layer 312. The first electrode 35 is in electrical contact with the first emitter 32 by penetrating through the first passivation layer 34, the second emitter 33 and the second dielectric layer 312 sequentially.

Similarly, the above structure may be formed by performing the patterned etching process once, which is used to sequentially etch a first emitter film and a first dielectric film stacked to form the first emitter 32 and the first dielectric layer 311. In addition, the second dielectric layer 312 and the second emitter 33 may be formed by a maskless deposition process. The design of the above structure may provide the second dielectric layer 312 which isolates the first emitter 32 from the second emitter 33 without increasing the patterned etching process, so as to inhibit the possible carrier recombination and interpenetration of doped ions between the first emitter 32 and the second emitter 33, and ensure the solar cell to have a relatively high photoelectric conversion efficiency.

In some embodiments, a material of the second dielectric layer 312 is different from a material of the first dielectric layer 311. For example, a dielectric constant of the material of the second dielectric layer 312 is smaller than a dielectric constant of the material of the first dielectric layer 311, so that the first dielectric layer 311 has a better tunneling effect and the second dielectric layer 312 has a better isolation effect. In other embodiments, a film thickness of the first dielectric layer 311 is different from a film thickness of the second dielectric layer 312. For example, under a condition that the dielectric constant of the material of the second dielectric layer 312 is smaller than the dielectric constant of the material of the first dielectric layer 311, and the tunneling effect of the material of the second dielectric layer 312 is weaker than the tunneling effect of the material of the first dielectric layer 311, the film thickness of the second dielectric layer 312 may be set to be smaller than the film thickness of the first dielectric layer 311, so that the second dielectric layer 312 has a good tunneling effect while meeting the isolation requirements.

The material of the second dielectric layer 312 is different from that of the first dielectric layer 311. In a first case, the first dielectric layer 311 and the second dielectric layer 312 are respectively composed of different single materials. In a second case, the first dielectric layer 311 is composed of a single material, while the second dielectric layer 312 includes a plurality of sub-film layers, and different sub-film layers have different materials. For example, the second dielectric layer 312 includes a first sub-film layer (not shown) and a second sub-film layer (not shown). The first sub-film layer covers the second surface 30b and the surface of the first emitter 32, while the second sub-film layer covers a surface of the first sub-film. In this way, a material of the first sub-film layer may be selected to make the first sub-film layer have a good passivation effect, reduce a surface defect and carrier recombination on the second surface 30b of the substrate 30, and a material of the second sub-film layer may be selected so that there is a good electrical isolation effect between the first emitter 32 and the second emitter 33.

Herein, the material of the first dielectric layer 311 includes at least one of oxygen silicide, nitrogen silicide and carbon silicide.

Figure 5:
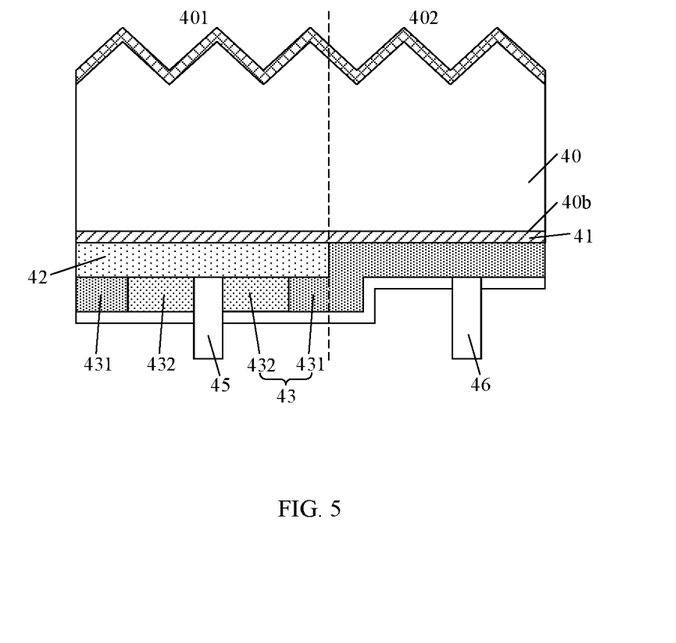
FIG. 5 is a schematic structural diagram of a solar cell according to some embodiments of the present disclosure.

In some embodiments, referring to FIG. 5, the second emitter 43 includes a first doped portion 431 and a second doped portion 432. At least part of the second doped portion 432 is disposed between the first doped portion 431 and the first electrode 45. A doping concentration of the first doped portion 431 is greater than or equal to a doping concentration of the second doped portion 432. Doping concentrations of different regions of the second doped portion 432 decreases in a direction of the first doped portion 431 towards the first electrode 45. Compared with providing an intrinsic polysilicon between the second emitter 43 and the first electrode 45 for isolation, providing the second doped portion 432 with a concentration gradient is beneficial to reducing a concentration difference between different interfaces, weakening a diffusive force of doped ions in the second emitter 43, preventing the intrinsic polysilicon from being uniformly doped due to a strong diffusive force, and ensuring that a contact surface between the first electrode 45 and the second doped portion 432 has a relatively large contact resistance, thereby suppressing a short-circuit current between the first electrode 45 and the second emitter 43.

In a case that a doping concentration of a surface layer of the second doped portion 432 facing the first doped portion 431 may be regarded as equal to the doping concentration of the first doped portion 431, it can be understood that the smaller the concentration gradient of the second doped portion 432, the smaller diffusive force of doped ions in the first doped portion 431 due to the concentration difference, and the better the barrier effect of the second doped portion 432. Under the condition that a doping concentration range of different regions of the second doped portion 432 remains unchanged, the smaller the concentration gradient of the second doped portion 432, the wider a width of the second doped portion 432 in the direction of the first doped portion 431 towards the first electrode 45. In other words, when the width of the second doped portion 432 and a minimum doping concentration of the second doped portion 432 are unchanged, the smaller the concentration gradient of the second doped portion 432, the lower the doping concentration of the first doped portion 431, and the weaker a conductivity of the first doped portion 431.

In some embodiments, the concentration gradient of the second doped portion 432 is in a range of 5E16 atoms×cm$^{-3}$/cm to 2E22 atoms×cm$^{-3}$/cm, such as 1E21 atoms×cm$^{-3}$/cm, 1E20 atoms×cm$^{-3}$/cm, 1E19 atoms×cm$^{-3}$/cm, 1E18 atoms×cm$^{-3}$/cm or 1E17 atoms×cm$^{-3}$/cm. If the concentration gradient is less than the above threshold, the width of the second doped portion 432 may be relatively wide to cover the second surface 40b of the second region 402, or the doping concentration of the first doped portion 431 may be relatively low, which is unfavorable for carriers in the substrate 40 to converge toward the second electrode 46 through the second emitter 43. If the concentration gradient is greater than the above threshold, it is unfavorable to block the diffusion of the doped ions in the first doped portion 431 to the first electrode 45.

In some embodiments, the width of the second doped portion 432 is greater than 20 μm in the direction of the first doped portion 431 towards the first electrode 45. Under the condition that the concentration gradient of the second doped portion 432 and the doping concentration of the first doped portion 431 are unchanged, if the width of the second doped portion 432 is smaller than 20 μm, a doping concentration of the contact surface between the second doped portion 432 and the first electrode 45 may be relatively high, and electrical isolation effect of the second doped portion 432 may be relatively weak. Under the condition that the concentration gradient and the minimum doping concentration of the second doped portion 432 are unchanged, if the width of the second doped portion 432 is smaller than 20 μm, the doping concentration of the first doped portion 431 may be relatively small, and the carrier transmission capability of the second emitter 43 may be relatively weak.

It should be noted that in some embodiments, the second emitter 43 in contact with the tunneling layer 41 is only disposed on a side of the first emitter 42, that is, the second region 402 is disposed at a side of the first region 401. In this case, the second doped portion 432 is arranged at two sides of the first electrode 45, which is used to block carriers passing through the tunneling layer 41 and entering the second emitter 43. In other embodiments, the second region 402 and the first region 401 are alternately arranged. The second region 402 is disposed at two sides of part of the first region 401, and the second emitter 43 in contact with the tunneling layer 41 is disposed at two sides of the first emitter 42. The second doped portion 432 is disposed at two sides of the first electrode 45.

In this embodiment, the second emitter is configured based on the first emitter. In the process for forming the first emitter and the second emitter, only one patterning process is required to form the first emitter, while the second emitter does not need a patterned etching to adjust the position accuracy after a maskless deposition process. In this way, only a position accuracy of the first emitter needs to be controlled, which is beneficial to reducing the alignment accuracy requirements in the preparation process of the solar cell; moreover, only one mask and one dry etching process are needed, which is beneficial to reducing the preparation cost of the solar cell.

An embodiment of the present disclosure further provides a solar cell, which is different from the solar structure shown in FIG. 1 in that the second emitter of the second region is electrically isolated from the second emitter of the first region, and there is a gap between the first emitter and the second emitter of the second region. The second emitter of the first region and the second emitter of the second region may be formed by the same process step.

Figure 6:
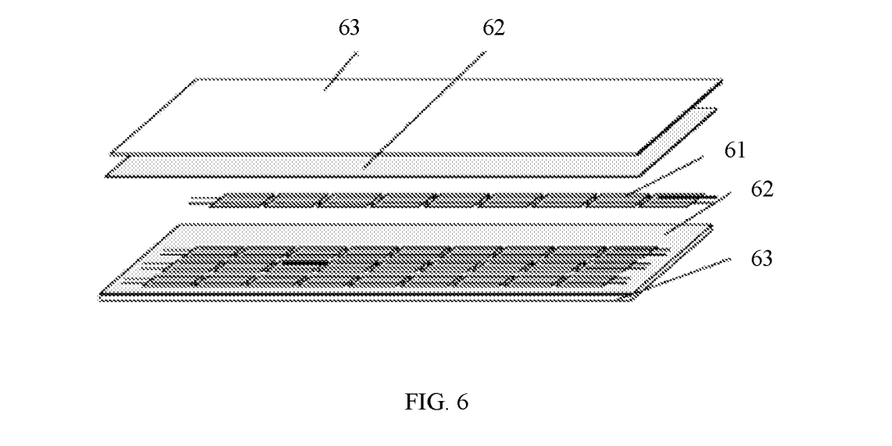
FIG. 6 is a schematic structural diagram of a solar cell module according to some embodiments of the present disclosure.

An embodiment of the present disclosure further provides a solar cell module, which is configured to convert received light energy into electric energy. Referring to FIG. 6, the solar cell module includes a cell string 61, an encapsulation film 62 and a cover plate 63. The cell string 61 is formed by connecting a plurality of solar cells, and the solar cell may be any one of the above-described solar cell (including but not limited to the solar cells shown in FIGS. 1-5). The encapsulation film 62 may be an organic encapsulation film such as EVA or POE or PET, and the encapsulation film 62 covers a surface of the cell string 61 for sealing. The cover plate 63 may be a glass cover plate, a plastic cover plate or the like. The cover plate 63 covers a surface of the encapsulation film 62 facing away from the cell string 61. In some embodiments, the cover plate 63 is provided with a light trapping structure to increase the utilization rate of an incident light. The solar cell module has a relatively high current collection capacity and a relatively low carrier recombination rate, and may realize relatively high photoelectric conversion efficiency.

Those skilled in the art should appreciate that the aforementioned embodiments are specific embodiments for implementing the present disclosure. In practice, however, various changes may be made in the forms and details of the specific embodiments without departing from the scope of the present disclosure. Any person skilled in the art may make their own changes and modifications without departing from the scope of the present disclosure, so the protection scope of the present disclosure shall be subject to the scope defined by the claims.

What is claimed is:

1. A solar cell, comprising a first region and a second region, wherein the solar cell further comprises:
a substrate having a first surface and an opposing second surface;
a tunneling layer covering the second surface, the tunneling layer having a first portion in the first region and a second portion in the second region;
a first emitter formed in the first region and on the first portion of the tunneling layer;
a second emitter having a first portion in the first region and a second portion in the second region, the first portion of the second emitter being formed on the first emitter and the second portion of the emitter being formed on the second portion of the tunneling layer, a conductivity type of the second emitter being different from a conductivity type of the first emitter;
a first electrode formed in the first region and configured to electrically connect with the first emitter by penetrating through the second emitter; and
a second electrode formed in the second region and configured to electrically connect with the second emitter;
wherein the second emitter comprises a first doped portion and a second doped portion, at least part of the second doped portion is formed between the first doped portion and the first electrode, doping concentration anywhere in the first doped portion is greater than or equal to doping concentration anywhere in the second doped portion, and doping concentration in the second doped portion decreases in a direction from the first doped portion towards the first electrode; and
wherein the second surface of the substrate has a step at a transition between the first region and the second region, the first emitter has a third surface facing away from the tunneling layer, the second emitter has a fourth surface in contact with the second portion of the tunneling layer, and the third surface is flush with the fourth surface or closer to the first surface of the substrate than the fourth surface.

2. The solar cell according to claim 1, wherein the tunneling layer comprises a first dielectric layer and a second dielectric layer, the first dielectric layer is formed between the first emitter and the substrate, the second dielectric layer is configured to cover a portion of the second surface of the substrate corresponding to the second region and cover a third surface and a sidewall of the first emitter, the third surface is a surface of the first emitter facing away from the first dielectric layer;
wherein the second emitter is disposed on the second dielectric layer, and the first electrode is further configured to electrically connect with the first emitter by penetrating through the second dielectric layer; and
wherein the first dielectric layer is composed of a single material, the second dielectric layer comprises a plurality of sub-film layers, and different sub-film layers have different materials.

3. The solar cell according to claim 2, wherein a dielectric constant of a material of the second dielectric layer is smaller than a dielectric constant of a material of the first dielectric layer, and a thickness of the second dielectric layer is smaller than a thickness of the first dielectric layer.

4. The solar cell according to claim 2, wherein the second dielectric layer includes a first sub-film layer and a second sub-film layer;
wherein the first sub-film layer of the second dielectric layer is configured to cover the portion of the second surface corresponding to the second region and cover the third surface and the sidewall of the first emitter, and the second sub-film layer of the second dielectric layer is configured to cover the surface of the first sub-film layer facing away from the substrate; and
wherein the first dielectric layer is made of a single material, and the first sub-film layer and the second sub-film layer are made of different materials.

5. The solar cell according to claim 1, further comprising a passivation layer covering surfaces of the first emitter and the second emitter facing away from the substrate.

6. The solar cell according to claim 2, wherein a material of the first dielectric layer comprises at least one of oxygen silicide, nitrogen silicide or carbon silicide.

7. The solar cell according to claim 1, wherein a material of the substrate includes at least one of monocrystalline silicon, polycrystalline silicon, amorphous silicon or microcrystalline silicon.

8. The solar cell according to claim 1, wherein a material of the substrate is a carbon simple substance, an organic material or a multicomponent compound.

9. The solar cell according to claim 8, wherein the multicomponent compound includes perovskite, gallium arsenide, cadmium telluride, and copper indium selenium.

10. A solar cell module, comprising:
at least one cell string formed by connecting a plurality of solar cells;
at least one encapsulation film configured to cover a surface of the at least one cell string; and
at least one cover plate configured to cover a surface of the at least one encapsulation film facing away from the at least one cell string;
wherein each solar cell of the plurality of solar cells includes a first region and a second region, and further includes:
a substrate having a first surface and an opposing second surface;
a tunneling layer covering the second surface, the tunneling layer having a first portion in the first region and a second portion in the second region;
a first emitter formed in the first region and on the first portion of the tunneling layer;
a second emitter having a first portion in the first region and a second portion in the second region, the first portion of the second emitter being formed on the first emitter and the second portion of the emitter being formed on the second portion of the tunneling layer, a conductivity type of the second emitter being different from a conductivity type of the first emitter;
a first electrode formed in the first region and configured to electrically connect with the first emitter by penetrating through the second emitter; and
a second electrode formed in the second region and configured to electrically connect with the second emitter;
wherein the second emitter comprises a first doped portion and a second doped portion, at least part of the second doped portion is formed between the first doped portion and the first electrode, doping concentration anywhere in the first doped portion is greater than or equal to doping concentration anywhere in the second doped portion, and doping concentration in the second doped portion decreases in a direction from the first doped portion towards the first electrode; and
wherein the second surface of the substrate has a step at a transition between the first region and the second region, the first emitter has a third surface facing away from the tunneling layer, the second emitter has a fourth surface in contact with the second portion of the tunneling layer, and the third surface is flush with the fourth surface or closer to the first surface of the substrate than the fourth surface.

11. The solar cell module according to claim 10, wherein the tunneling layer comprises a first dielectric layer and a second dielectric layer, the first dielectric layer is formed between the first emitter and the substrate, the second dielectric layer is configured to cover a portion of the second surface of the substrate corresponding to the second region and cover a third surface and a sidewall of the first emitter, the third surface is a surface of the first emitter facing away from the first dielectric layer;

wherein the second emitter is disposed on the second dielectric layer, and the first electrode is further configured to electrically connect with the first emitter by penetrating through the second dielectric layer; and wherein the first dielectric layer is composed of a single material, the second dielectric layer comprises a plurality of sub-film layers, and different sub-film layers have different materials.

12. The solar cell module according to claim 11, wherein a dielectric constant of a material of the second dielectric layer is smaller than a dielectric constant of a material of the first dielectric layer, and a thickness of the second dielectric layer is smaller than a thickness of the first dielectric layer.

13. The solar cell module according to claim 11, wherein the second dielectric layer includes a first sub-film layer and a second sub-film layer;

wherein the first sub-film layer of the second dielectric layer is configured to cover the portion of the second surface corresponding to the second region and cover the third surface and the sidewall of the first emitter, and the second sub-film layer of the second dielectric layer is configured to cover the surface of the first sub-film layer facing away from the substrate; and wherein the first dielectric layer is made of a single material, and the first sub-film layer and the second sub-film layer are made of different materials.

14. The solar cell module according to claim 10, further comprising a passivation layer covering surfaces of the first emitter and the second emitter facing away from the substrate.

15. The solar cell module according to claim 11, wherein a material of the first dielectric layer comprises at least one of oxygen silicide, nitrogen silicide or carbon silicide.

16. The solar cell module according to claim 10, wherein a material of the substrate includes at least one of monocrystalline silicon, polycrystalline silicon, amorphous silicon or microcrystalline silicon.

17. The solar cell module according to claim 10, wherein a material of the substrate is a carbon simple substance, an organic material or a multicomponent compound.

18. The solar cell module according to claim 17, wherein the multicomponent compound includes perovskite, gallium arsenide, cadmium telluride, and copper indium selenium.

* * * * *